United States Patent
Yamazaki (10) Patent No.: US 12,184,190 B2
(45) Date of Patent: Dec. 31, 2024

(54) POWER CONVERSION DEVICE

(71) Applicant: DENSO CORPORATION, Kariya (JP)

(72) Inventor: Daisuke Yamazaki, Kariya (JP)

(73) Assignee: DENSO CORPORATION, Kariya (JP)

( * ) Notice: Subject to any disclaimer, the term of this patent is extended or adjusted under 35 U.S.C. 154(b) by 180 days.

(21) Appl. No.: 17/965,271

(22) Filed: Oct. 13, 2022

(65) Prior Publication Data

US 2023/0032317 A1 Feb. 2, 2023

Related U.S. Application Data

(63) Continuation of application No. PCT/JP2021/009884, filed on Mar. 11, 2021.

(30) Foreign Application Priority Data

Apr. 15, 2020 (JP) .................. 2020-073049

(51) Int. Cl.
*H02M 7/48* (2007.01)
*H02M 7/00* (2006.01)
*H05K 1/18* (2006.01)

(52) U.S. Cl.
CPC ............. *H02M 7/003* (2013.01); *H02M 7/48* (2013.01); *H05K 1/181* (2013.01); *H05K 2201/09572* (2013.01); *H05K 2201/10015* (2013.01); *H05K 2201/10272* (2013.01)

(58) Field of Classification Search
CPC ........ H02M 7/003; H02M 7/48; H05K 1/181; H05K 2201/09572; H05K 2201/10015; H05K 2201/10272
See application file for complete search history.

(56) References Cited

U.S. PATENT DOCUMENTS

| | | | |
|---|---|---|---|
| 11,973,432 B2 * | 4/2024 | Ichijyo | H02M 7/003 |
| 2017/0093060 A1 | 3/2017 | Ozaki | |
| 2017/0149223 A1 | 5/2017 | Sasaki et al. | |
| 2023/0084775 A1 * | 3/2023 | Sakamoto | H05K 7/20927 |
| | | | 361/700 |

FOREIGN PATENT DOCUMENTS

| | | |
|---|---|---|
| JP | 2011-183987 A | 9/2011 |
| JP | 2019-97237 A | 6/2019 |
| JP | 2019-115242 A | 7/2019 |
| JP | 2020-162226 A | 10/2020 |

* cited by examiner

*Primary Examiner* — Adolf D Berhane
(74) *Attorney, Agent, or Firm* — Oliff PLC (57) ABSTRACT

A power conversion device includes a first electrical component, a second electrical component, a housing, a board, and a guide part. The first and second electrical components are accommodated in and fixed to the housing. The board has first through holes into which first signal terminals of the first electrical components are inserted, and second through holes into which second signal terminals of the second electrical components are inserted. The guide part is connected to the board so that guide holes formed therein are aligned with the second through holes. The first signal terminals are connected to the board through a first connection portion, and the second signal terminals are connected to the board through a second connection portion. A number of the first through holes disposed per unit area is greater than a number of second through holes disposed per unit area.

3 Claims, 7 Drawing Sheets

POWER CONVERSION DEVICE

CROSS REFERENCE TO RELATED APPLICATIONS

The present application is a continuation application of International Patent Application No. PCT/JP2021/009884 filed on Mar. 11, 2021, which designated the U.S. and claims the benefit of priority from Japanese Patent Application No. 2020-073049 filed on Apr. 15, 2020. The entire disclosures of all of the above applications are incorporated herein by reference.

TECHNICAL FIELD

The present disclosure relates to a power conversion device.

BACKGROUND

For example, there is a power conversion device having a semiconductor module, a current sensor, and a control circuit board. The semiconductor module includes plural control terminals, and the current sensor includes plural signal terminals. The control terminals and the signal terminals are connected to the control circuit board.

SUMMARY

The present disclosure describes a power conversion device, which is capable of suppressing damage to signal terminals. According to an aspect of the present disclosure, a power conversion device includes a first electrical component, a second electrical component, a housing, a board, a guide part, a first connection portion, and a second connection portion. The first electrical component includes a plurality of first signal terminals. The second electrical component includes a plurality of second signal terminals. The housing accommodates and fixes the first electrical component and the second electrical component. The board has a first surface and a second surface opposite to the first surface in a predetermined direction that is orthogonal to the first surface, and is formed with a plurality of first through holes into which the plurality of first signal terminals are inserted, and a plurality of second through holes into which the plurality of second signal terminals are inserted. The plurality of first through holes and the plurality of second through holes define openings on the first surface and the second surface of the board. The guide part is formed with a plurality of guide holes that define openings in the predetermined direction. The guide part is connected to at least one of the first surface and the second surface of the board, and the plurality of guide holes are aligned with the plurality of second through holes in the predetermined direction. The first connection portion connects the plurality of first signal terminals to the board, and the second connection portion connects the plurality of second signal terminals to the board. Further, a number of the first through holes disposed per unit area is greater than a number of the second through holes disposed per unit area.

BRIEF DESCRIPTION OF DRAWINGS

Features and advantages of the present disclosure will become more apparent from the following detailed description made with reference to the accompanying drawings, in which.

DETAILED DESCRIPTION

For example, there is a power conversion device having a semiconductor module, a current sensor, and a control circuit board. The semiconductor module includes plural control terminals, and the current sensor includes plural signal terminals. The control terminals and the signal terminals are connected to the control circuit board. In such a power conversion device, if the plural control terminals and the plural signal terminals are connected to the control circuit board with solder, there is a fear that the control terminals and the signal terminals may be damaged due to vibrations caused by external force or the like.

The present disclosure provides a power conversion device, which is capable of suppressing damage to terminals.

According to an aspect of the present disclosure, a power conversion device includes a first electrical component, a second electrical component, a housing, a board, a guide part, a first connection portion, and a second connection portion. The first electrical component includes a plurality of first signal terminals. The second electrical component includes a plurality of second signal terminals. The housing accommodates and fixes the first electrical component and the second electrical component. The board has a first surface and a second surface opposite to the first surface in a predetermined direction that is orthogonal to the first surface, and is formed with a plurality of first through holes into which the plurality of first signal terminals are inserted, and a plurality of second through holes into which the plurality of second signal terminals are inserted. The plurality of first through holes and the plurality of second through holes define openings on the first surface and the second surface of the board. The guide part is formed with a plurality of guide holes that define openings in the predetermined direction. The guide part is connected to at least one of the first surface and the second surface of the board, and the plurality of guide holes are aligned with the plurality of second through holes in the predetermined direction. The first connection portion connects the plurality of first signal terminals to the board, and the second connection portion connects the plurality of second signal terminals to the board. Further, a number of the first through holes disposed per unit area is greater than a number of the second through holes disposed per unit area.

In such a configuration, the number of the first through holes included per unit area is greater than the number of the second through holes included per unit area. Thus, the number of connection points of the first connection portion, which connects the first signal terminals to the board, included per unit area is greater than the number of connection points of the second connection portion, which connects the second signal terminals to the board, included per unit area. Therefore, it is less likely that the board will be deformed in a location where the first through holes are formed. It is less likely that the plural first signal terminals will be damaged.

The guide part is connected to a location of the board where the plural second through holes are formed. Therefore, it is less likely that the board will be deformed in a location where the guide part is connected. It is less likely that the plural second signal terminals will be damaged.

Thus, even if the guide part is provided only to the location of the board where the plural second through holes are formed, it is less likely that the plural first signal terminals and the plural second signal terminals will be damaged. Since the guide part is provided only partially, it is less likely that the size of the power conversion device will increase.

The following will describe embodiments for carrying out the present disclosure with reference to the drawings. In each of the embodiments, parts corresponding to the elements described in the preceding embodiments will be denoted by the same reference numerals, and redundant explanation may be omitted. When only a part of a configuration is described in an embodiment, the other preceding embodiments can be applied to the other parts of the configuration.

In addition, it is possible to combine parts that are specifically stated to be combinable in each embodiment. It is also possible to partially combine the embodiments, the embodiment and the modified examples, and the modified examples, even if they are not explicitly stated, unless there is a particular problem with the combination.

First Embodiment

First, an in-vehicle system 100 provided with a power conversion device 300 will be described with reference to FIG. 1. The in-vehicle system 100 constitutes a system for a battery electric vehicle. The in-vehicle system 100 includes a battery 200, the power conversion device 300, and a motor 400.

The in-vehicle system 100 also includes a plurality of electronic control units (ECUs) (not shown). The ECUs transmit and receive signals to and from each other via a bus wiring. The ECUs cooperate to control a battery electric vehicle. Regeneration and power running of the motor 400 according to a state of charge (SOC) of the battery 200 are controlled by the ECUs.

The battery 200 includes plural secondary batteries. The plural secondary batteries form a battery stack connected in series. The SOC of the battery stack corresponds to the SOC of the battery 200. As the secondary batteries, a lithium ion secondary battery, a nickel hydrogen secondary battery, an organic radical battery, or the like can be adopted.

<Power Conversion Device>

The power conversion device 300 has an inverter 500. The power conversion device 300 performs power transformation between the battery 200 and the motor 400, as the inverter 500. The power conversion device 300 converts direct current (DC) power of the battery 200 into alternate current (AC) power. The power conversion device 300 converts AC power generated by power generation (regeneration) of the motor 400 into DC power.

The motor 400 is connected to an output shaft of a battery electric vehicle, which is not shown. Rotational energy of the motor 400 is transmitted to traveling wheels of the battery electric vehicle via the output shaft. On the contrary, the rotational energy of the traveling wheels is transmitted to the motor 400 via the output shaft.

The motor 400 is driven by the AC power supplied from the power conversion device 300. Accordingly, propulsive force is applied to the traveling wheels. Further, the motor 400 is regenerated by the rotational energy transmitted from the traveling wheels. The AC power generated by this regeneration is converted into the DC power by the power conversion device 300. This DC power is supplied to the battery 200. The DC power is also supplied to various electrical loads mounted on the battery electric vehicle.

The inverter 500 includes semiconductor elements such as switches, which will be described later. In the present embodiment, an n-channel insulated gate bipolar transistor (IGBT) is used as the switch. However, the switch is not particularly limited, and may be provided by a metal-oxide field effect transistor (MOSFET), in place of the IGBT. If the MOSFET is used as the switch, a diode may be omitted.

The switch may be produced by a semiconductor such as silicon (Si) or wide-gap semiconductors such as silicon carbide (SiC). A material of a semiconductor element is not particularly limited.

<Inverter>

The inverter 500 has a capacitor 530 and a leg group 510. A first power supply bus bar 301 and a second power supply bus bar 302 are connected to the battery 200. The capacitor 530 and the leg group 510 are connected in parallel between the first power supply bus bar 301 and the second power supply bus bar 302. The leg group 510 and the motor 400 are connected to each other via an output bus bar 440.

The leg group 510 includes a U-phase leg 513, a V-phase leg 514, and a W-phase leg 515. Each of the legs in three phases has two switches connected in series.

Each of the U-phase leg 513, the V-phase leg 514 and the W-phase leg 515 has a high-side switch 511 and a low-side switch 512 as switches. Each of the U-phase leg 513, the V-phase leg 514 and the W-phase leg 515 has a high-side diode 511a and a low-side diode 512a as diodes.

Figure 1:
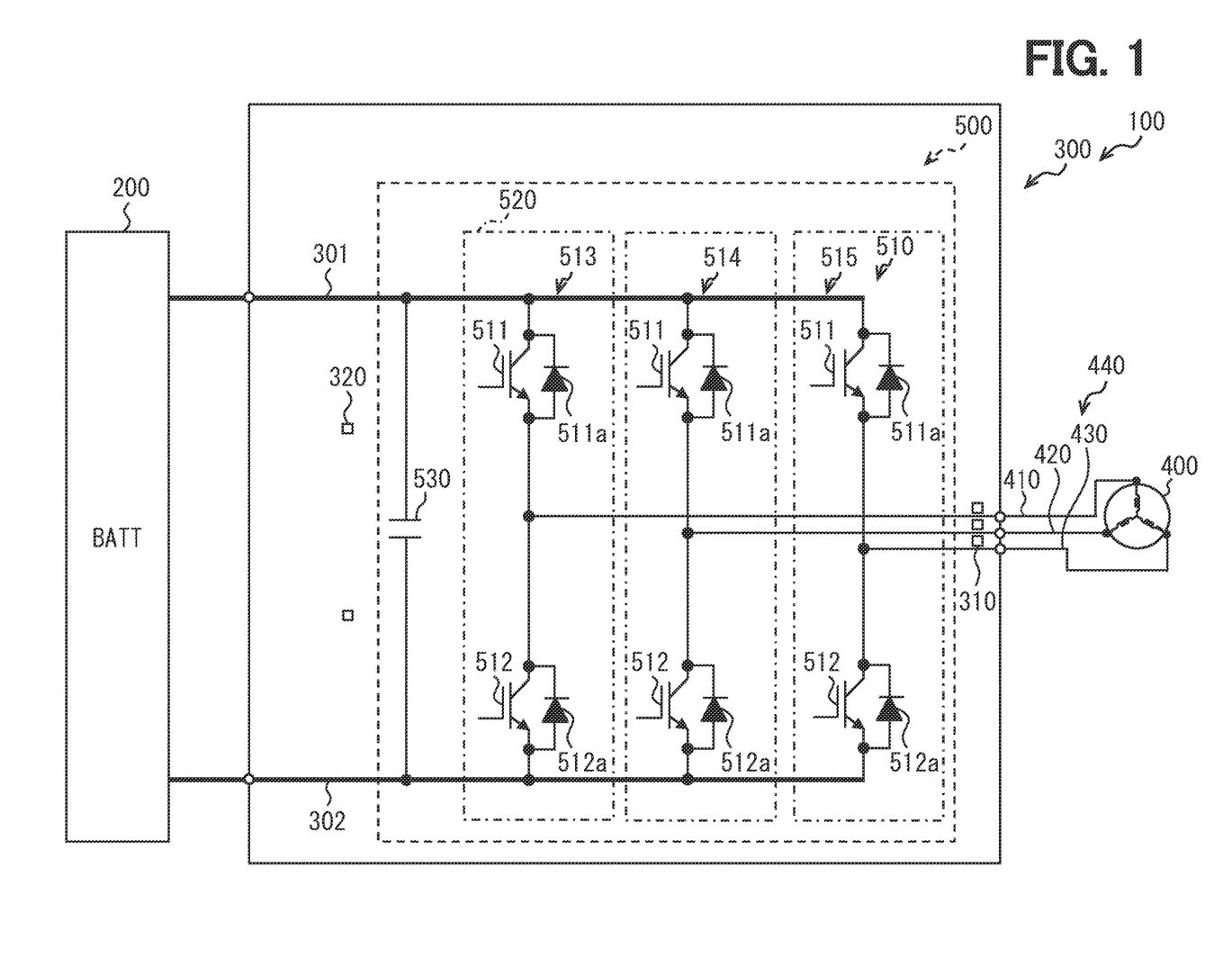
FIG. 1 is a circuit diagram of an in-vehicle system.

As shown in FIG. 1, a collector electrode of the high-side switch 511 is connected to the first power supply bus bar 301. An emitter electrode of the high-side switch 511 and a collector electrode of the low-side switch 512 are connected to each other. An emitter electrode of the low-side switch 512 is connected to the second power supply bus bar 302. As such, the high-side switch 511 and the low-side switch 512 are serially connected in order from the first power supply bus bar 301 toward the second power supply bus bar 302.

These switches are encapsulated with a resin member 521. Thus, a switch module 520 is configured. A part of the collector terminal connected to the collector electrode of the high-side switch 511 is exposed from the resin member 521. A part of the emitter terminal connected to the emitter electrode of the low-side switch 512 is exposed from the resin member 521. A part of each switch terminal 522, such as a sensor terminal and a part of a gate terminal connected to a gate electrode of each of the high-side switch 511 and the low-side switch 512, is exposed from the resin member 521. The switch terminal 522 corresponds to a first signal terminal.

In addition to these terminals, a part of an output terminal connected to an emitter electrode of the high-side switch 511 and a collector electrode of the low-side switch 512 is exposed from the resin member 521.

A cathode electrode of the high-side diode 511a is connected to the collector electrode of the high-side switch 511. An anode electrode of the high-side diode 511a is connected to the emitter electrode of the high-side switch 511. Thus, the high-side switch 511 and the high-side diode 511a are connected in anti-parallel.

A cathode electrode of the low-side diode 512a is connected to the collector electrode of the low-side switch 512. An anode electrode of the low-side diode 512a is connected to the emitter electrode of the low-side switch 512. Thus, the low-side switch 512 and the low-side diode 512a are connected in anti-parallel.

A U-phase bus bar 410 is connected to the output terminal that is connected to the emitter electrode of the high-side switch 511 and the collector electrode of the low-side switch 512 provided in the U-phase leg 513. The U-phase bus bar 410 is connected to a U-phase stator coil of the motor 400.

A V-phase bus bar 420 is connected to the output terminal that is connected to the emitter electrode of the high-side switch 511 and the collector electrode of the low-side switch 512 provided in the V-phase leg 514. The V-phase bus bar 420 is connected to a V-phase stator coil of the motor 400.

A W-phase bus bar 430 is connected to the output terminal that is connected to the emitter electrode of the high-side switch 511 and the collector electrode of the low-side switch 512 provided in the W-phase leg 515. The W-phase bus bar 430 is connected to a W-phase stator coil of the motor 400.

When the motor 400 is powered, the high-side switches 511 and the low-side switches 512 of the leg group 510 are respectively PWM-controlled by a control signal from the ECU. PWM is an abbreviation of pulse width modulation. Accordingly, the inverter 500 generates a three-phase alternating current. When the motor 400 generates (regenerates) power, the ECU stops outputting the control signal, for example. Accordingly, the AC power generated by the power generation of the motor 400 passes through the diodes provided in the three-phase leg group 510. As a result, the AC power is converted to DC power.

<Sensor>

A current sensor 310 is provided on the U-phase bus bar 410, the V-phase bus bar 420 and the W-phase bus bar 430. The current sensor 310 detects AC current flowing between the plural legs of the inverter 500 and the motor 400. The current sensor 310 has a current detection terminal group 452 having plural current detection terminals 451. The current detection terminal 451 corresponds to a second signal terminal.

In addition, a voltage sensor 320 is provided on the first power supply bus bar 301 and the second power supply bus bar 302 that are connected to the two electrodes of the capacitor 530 respectively. The voltage sensor 320 detects the voltage between the two electrodes of the capacitor 530. The voltage sensor 320 has a voltage detection terminal group 532 including plural voltage detection terminals 531. The voltage detection terminal 531 corresponds to a second signal terminal.

<Configuration of Power Conversion Device>

Next, the configuration of the power conversion device 300 will be described. Hereinafter, three directions orthogonal to one another are referred to as an x direction, a y direction, and a z direction. The z direction corresponds to an arrangement direction. The arrangement direction will also be referred to as a predetermined direction. A direction orthogonal to the z direction is referred to as a planar direction. The x direction and the y direction are included in the planar direction. In other words, the x direction and the y direction are included in an xy plane orthogonal to the z direction. In the drawings, the term "direction" is omitted. In the drawings, the battery 200 is abbreviated as "BATT".

Figure 2:
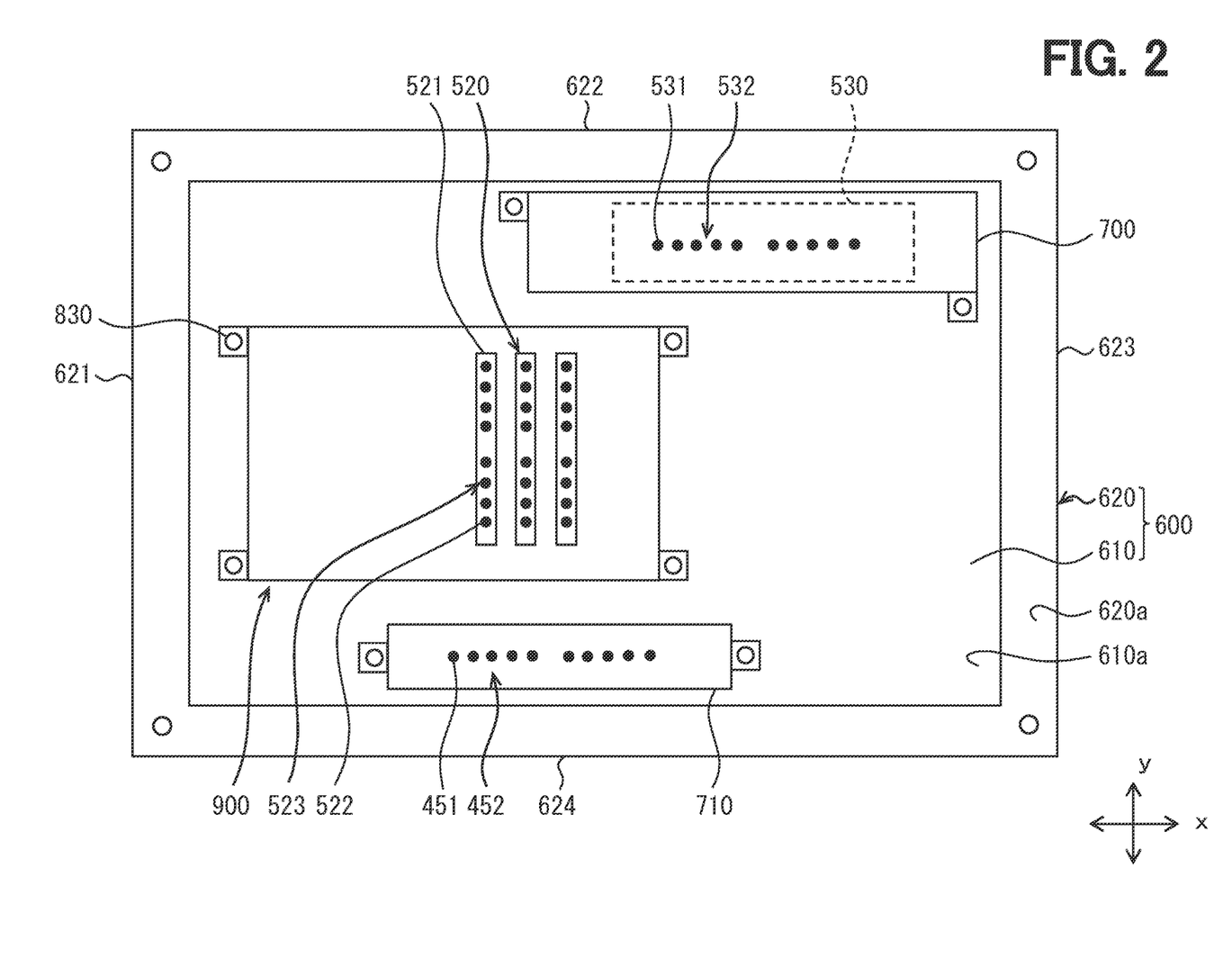
FIG. 2 is a top view of a power conversion device for explaining components of the power conversion device.

As shown in FIG. 2, the power conversion device 300 includes a housing 600, a capacitor case 700, a terminal block 710, a board 800, a guide part 840, a fixing part 850, a first solder portion 860, a second solder portion 870 and a cooler, in addition to the inverter 500 described above. The first solder portion 860 corresponds to a first connection portion. The fixing part 850 and the second solder portion 870 correspond to a second connection portion. The second solder portion 870 corresponds to a solder member.

The switch module 520 described hereinabove is stacked on the cooler. A power module 900 is thus configured. The power module 900 corresponds to a first electrical component. The capacitor case 700 and the terminal block 710 correspond to a second electrical component. Note that the first electrical component is not limited to the power module 900 alone, and may include an electrical device in addition to the power module 900.

As shown in FIG. 2, the housing 600 has a bottom portion 610 and a side wall portion 620. The bottom portion 610 has a flat shape with a thin thickness in the z direction. The bottom portion 610 has an inner bottom surface 610a and an outer bottom surface on a back side of the inner bottom surface 610a. The inner bottom surface 610a and the outer bottom surface are opposite to and aligned in the z direction.

The side wall portion 620 is connected to the inner bottom surface 610a. The side wall portion 620 extends from the inner bottom surface 610a to be away from the outer bottom surface, and has a loop shape.

The side wall portion 620 includes a first wall portion 621 and a third wall portion 623 facing and spaced apart from each other in the x direction, and a second wall portion 622 and a fourth wall portion 624 facing and spaced apart from each other in the y direction.

The first wall portion 621, the second wall portion 622, the third wall portion 623, and the fourth wall portion 624 are connected to each other to form the loop shape about an axis along the z-direction. The side wall portion 620 defines an opening of the housing 600 at an end opposite to the bottom portion 610 in the z direction.

Figure 5:
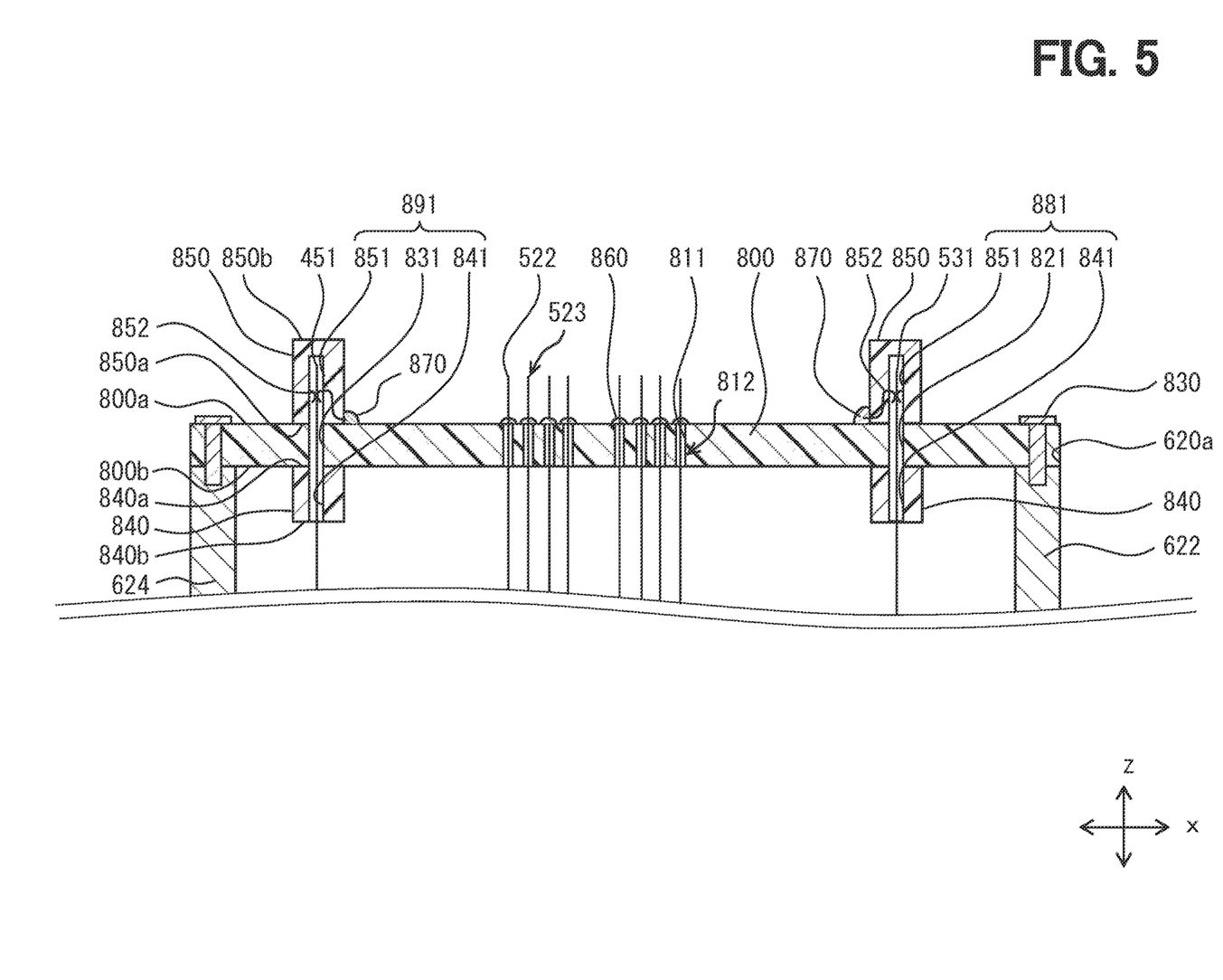
FIG. 5 is a cross-sectional view taken along a line V-V in FIG. 4.

The capacitor case 700, the terminal block 710, and the power module 900 are housed in an accommodation space of the housing 600 defined by the bottom portion 610 and the first to fourth wall portions 621 to 624 described above. As shown in FIG. 5, the board 800 is provided on an upper end surface 620a of the side wall portion 620 on the tip side.

As shown in FIGS. 2 and 5, the capacitor case 700, the terminal block 710, the power module 900, and the board 800 are each fixed to the housing 600 by fastening members 830 or the like.

The capacitor case 700, the terminal block 710, and the power module 900 are connected to the bottom portion 610 via the fastening members 830. The board 800 is connected to the upper end surface 620a through the fastening members 830 at the ends in the planar direction. Note that the portions to which the capacitor case 700, the terminal block 710, and the power module 900 are fixed are not limited to the bottom portion 610. The capacitor case 700, the terminal block 710, and the power module 900 may be partly or fully connected to the side wall portion 620 through the fastening members 830.

As shown in FIG. 2, the capacitor case 700, the terminal block 710, and the power module 900 are arranged side by side in the accommodation space of the housing 600 so as to be spaced apart in the y direction.

In the accommodation space, the capacitor case 700 and the terminal block 710 are arranged adjacent to the ends in the y direction. In the accommodation space, the power module 900 is arranged adjacent to a center in the y direction.

Specifically, the capacitor case 700 is arranged adjacent to the second wall portion 622 in the y direction. The terminal block 710 is arranged adjacent to the fourth wall portion 624 in the y direction. The power module 900 is arranged between the capacitor case 700 and the terminal block 710 in the y direction.

The capacitor case 700 is a housing providing an accommodation space thereinside. The capacitor 530 is accommodated in the accommodation space of the capacitor case 700.

As described above, the first power supply bus bar 301 and the second power supply bus bar 302 are connected to the capacitor 530. The voltage sensor 320 is provided on the first power supply bus bar 301 and the second power supply bus bar 302. The voltage sensor 320 has the voltage detection terminal group 532 including the plural voltage detection terminals 531.

The capacitor 530, a part of the first power supply bus bar 301 and a part of the second power supply bus bar 302 are accommodated in the accommodation space of the capacitor case 700. These parts are sealed with a sealing resin in the accommodation space of the capacitor case 700.

A rest part of the first power supply bus bar 301, a rest part of the second power supply bus bar 302 and the voltage sensor 320 is exposed from the sealing resin and the capacitor case 700. The voltage detection terminal group 532 is exposed from the sealing resin and the capacitor case 700.

The part of the first power supply bus bar 301 and the part of the second power supply bus bar 302, which are exposed from the sealing resin and the capacitor case 700, extend toward the power module 900 from the capacitor case 700. These parts of the first power supply bus bar 301 and the second power supply bus bar 302 are electrically and mechanically connected to the power module 900.

The rest part of the first power supply bus bar 301 and the rest part of the second power supply bus bar 302, which are exposed from the sealing resin and the capacitor case 700, extend from the capacitor case 700 toward a first connector (not shown) that is connected to the battery 200. These parts of the first power supply bus bar 301 and the second power supply bus bar 302 are electrically and mechanically connected to the first connector. Note that, in FIG. 2, illustration of the first power supply bus bar 301, the second power supply bus bar 302, and the first connector are omitted.

The voltage detection terminal group 532 exposed from the sealing resin and the capacitor case 700 extends toward the board 800 to be away from the capacitor case 700. The voltage detection terminal group 532 extending toward the board 800 is electrically and mechanically connected to the board 800. A specific form of connection between the voltage detection terminal group 532 and the board 800 will be described later.

The terminal block 710 is a support base to support the U-phase bus bar 410, the V-phase bus bar 420 and the W-phase bus bar 430. The terminal block 710 is made of a resin. As described above, the current sensor 310 is provided on the U-phase bus bar 410, the V-phase bus bar 420 and the W-phase bus bar 430. The current sensor 310 has a current detection terminal group 452 having plural current detection terminals 451.

A part of each of the U-phase bus bar 410, the V-phase bus bar 420 and the W-phase bus bar 430 and a part of the current sensor 310 are insert-molded in the terminal block 710.

A rest part of each of the U-phase bus bar 410, the V-phase bus bar 420 and the W-phase bus bar 430 and a rest part of the current sensor 310 are exposed from the terminal block 710. The current detection terminal group 452 is exposed from the terminal block 710.

A part of each of the U-phase bus bar 410, the V-phase bus bar 420 and the W-phase bus bar 430, which are exposed from the terminal block 710, extends from the terminal block 710 toward the power module 900. These parts are electrically and mechanically connected to the power module 900.

A rest part of each of the U-phase bus bar 410, the V-phase bus bar 420 and the W-phase bus bar 430, which are exposed from terminal block 710, extends from the terminal block 710 toward a second connector (not shown) to which the motor 400 is connected. These parts are electrically and mechanically connected to the second connector. Note that, in FIG. 2, illustration of the U-phase bus bar 410, the V-phase bus bar 420, the W-phase bus bar 430 and the second connector are omitted.

The current detection terminal group 452 exposed from the terminal block 710 extends toward the board 800 to be away from the terminal block 710. The current detection terminal group 452 extending toward the board 800 is electrically and mechanically connected to the board 800. A specific form of connection between the current detection terminal group 452 and the board 800 will be described later.

The power module 900 includes the cooler and the plural switch modules 520 as described above. The switch modules 520 are stacked on the cooler. The switch terminals 522 are partly exposed from the resin member 521 of the switch module 520.

The plural switch terminals 522 are stacked on top of another to form a switch terminal group 523. The switch terminal group 523 extends toward the board 800 to be away from the resin member 521. The switch terminal group 523 extending toward the board 800 is electrically and mechanically connected to the board 800. A specific form of connection between the switch terminal group 523 and the board 800 will be described later.

Figure 3:
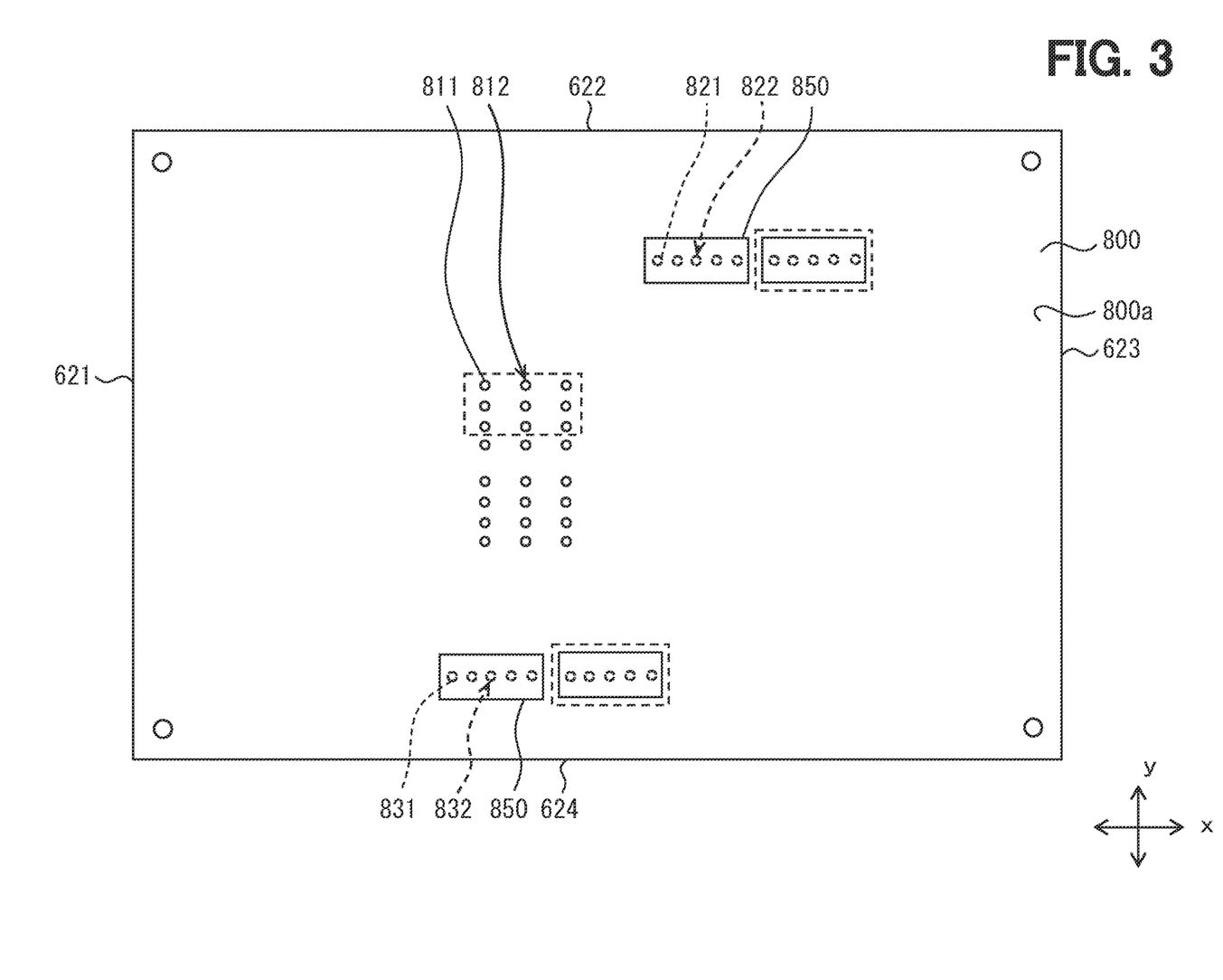
FIG. 3 is a top view of a board.

The board 800 has a flat shape with a small thickness in the z direction. The board 800 has an upper surface 800a and a lower surface 800b opposite to each other in the z-direction. The board 800 is formed with plural switch terminal holes 811, plural voltage detection terminal holes 821, and plural current detection terminal holes 831, which define openings on the upper surface 800a and the lower surface 800b. The switch terminal hole 811 corresponds to a first through hole. The voltage detection terminal hole 821 and the current detection terminal hole 831 each correspond to a second through hole.

The plural switch terminal holes 811 constitute a switch terminal hole group 812. The plural voltage detection terminal holes 821 constitute a voltage detection terminal hole group 822. The plural current detection terminal holes 831 constitute a current detection terminal hole group 832.

As shown in FIG. 3, the switch terminal hole group 812, the voltage detection terminal hole group 822, and the current detection terminal hole group 832 are disposed on the board 800 so as to be spaced apart from each other in the y direction.

The voltage detection terminal hole group 822 and the current detection terminal hole group 832 are disposed adjacent to the ends of the board 800 in the y direction. The switch terminal hole group 812 is disposed adjacent to the center of the board 800 in the y direction.

Specifically, the voltage detection terminal hole group 822 is disposed at a location adjacent to the second wall portion 622 on the board 800. The current detection terminal hole group 832 is disposed at a location adjacent to the fourth wall portion 624 on the board 800. The switch terminal hole group 812 is disposed between the voltage detection terminal hole group 822 and the current detection terminal hole group 832.

Guide parts 840 are connected to the lower surface 800b of the board 800 at positions corresponding to the location where the voltage detection terminal hole group 822 is disposed and the location where the current detection terminal hole group 832 is disposed. Fixing parts 850 are connected to the upper surface 800a of the board 800 at positions corresponding to the location where the voltage detection terminal hole group 822 is disposed and the location where the current detection terminal hole group 832 is disposed.

The guide part 840 may be connected to the lower surface 800b at a part of the position corresponding to the location where the voltage detection terminal hole group 822 is disposed. The guide part 840 may be connected to the lower surface 800b at a part of the position corresponding to the location where the current detection terminal hole group 832 is disposed. The guide part 840 may be connected to the lower surface 800b at a position corresponding to either the location where the voltage detection terminal hole group 822 is disposed or the location where the current detection terminal hole group 832 is disposed.

The guide part 840 and the fixing part 850 are aligned in the z direction. Each of the guide part 840 and the fixing part 850 is connected to the board 800 via solder.

The guide part 840 has substantially a rectangular parallelepiped shape. The guide part 840 is made of an insulating resin or the like. The guide part 840 has a first side surface 840a adjacent to the lower surface 800b of the board 800, and a second side surface 840b opposite to the first side surface 840a in the z direction. The guide part 840 is formed with plural guide holes 841 passing therethrough from the first side surface 840a to the second side surface 840b.

As the guide part 840 is connected to the board 800, the plural guide holes 841 and the plural voltage detection terminal holes 821 are in communication with each other in the z direction. The plural guide holes 841 and the plural current detection terminal holes 831 are in communication with each other in the z direction.

The fixing part 850 has substantially a rectangular parallelepiped shape. The fixing part 850 is made of an insulating resin or the like. The fixing part 850 has a third side surface 850a adjacent to the upper surface 800a of the board 800, and a fourth side surface 850b opposite to the third side surface 850a in the z direction. The fixing part 850 is formed with plural fixing holes 851 recessed from the third side surface 850a toward the fourth side surface 850b.

As shown in FIG. 5, plural conductive members 852 are insert-molded in the fixing part 850. A part of each of the plural conductive members 852 is exposed from a wall surface of the fixing part 850 defining the fixing hole 851. Inside the fixing hole 851, the parts of the conductive members 852a exposed from the wall surfaces that facing in the x direction and defining the fixing hole 851 face each other in the x direction. A part of each of the plural conductive members 852 is exposed from the outer wall surface of the fixing part 850 to separate from the fixing hole 851. The part of the conductive member 852 exposed from the outer wall surface of the fixing part 850 is connected to the board 800 via a second solder portion 870.

By connecting the fixing part 850 to the board 800 in this manner, the plural fixing holes 851 and the plural voltage detection terminal holes 821 are in communication with each other in the z direction. The plural fixing holes 851 and the plural current detection terminal holes 831 are in communicate with each other in the z direction.

Therefore, plural voltage detection communication holes 881 are formed by the plural guide holes 841, the plural voltage detection terminal holes 821 and the plural fixing holes 851. Likewise, plural current detection communication holes 891 are formed by the plural guide holes 841, the plural current detection terminal holes 831 and the plural fixing holes 851.

<Connection Between Terminals and Board>

As shown in FIG. 5, the plural switch terminals 522 are inserted into the plural switch terminal holes 811 described above. The switch terminals 522 inserted into the switch terminal holes 811 are connected to the board 800 via the first solder portion 860. The switch terminals 522 are thus electrically and mechanically connected to the board 800.

As shown in FIG. 5, the plural voltage detection terminals 531 are correspondingly inserted into the plural voltage detection communication holes 881 described above. The plural current detection terminals 451 are correspondingly inserted into the plural current detection communication holes 891 described above.

As described above, the portions exposed from the wall surfaces of the plural conductive members 852 face each other in the x direction inside the fixing hole 851. The plural voltage detection terminals 531 are inserted between the plural conductive members 852 exposed from the facing wall surfaces of the fixing part 850 defining the plural voltage detection communication holes 881. The plural current detection terminals 451 are inserted between the plural conductive members 852 exposed from the facing wall surfaces of the fixing part 850 defining the plural current detection communication holes 891.

As such, the plural voltage detection terminals 531 inserted into the plural voltage detection communication holes 881 and the plural current detection terminals 451 inserted into the plural current detection communication holes 891 are respectively pressed by the plural conductive members 852.

Therefore, the plural voltage detection terminals 531 and the plural current detection terminals 451 are held between the plural conductive members 852 in the x direction. Also, as described above, the plural conductive members 852 are partly exposed from the outer wall surface of the fixed part 850. The parts of the plural conductive members 852 exposed from the outer wall surface are connected to the board 800 via the second solder portions 870. Thus, the plural voltage detection terminals 531 and the plural current detection terminals 451 are electrically and mechanically connected to the board 800. It is sufficient that the parts of the plural conductive members 852 exposed from the inner wall surfaces face each other in the planar direction inside the fixing holes 851.

Figure 4:
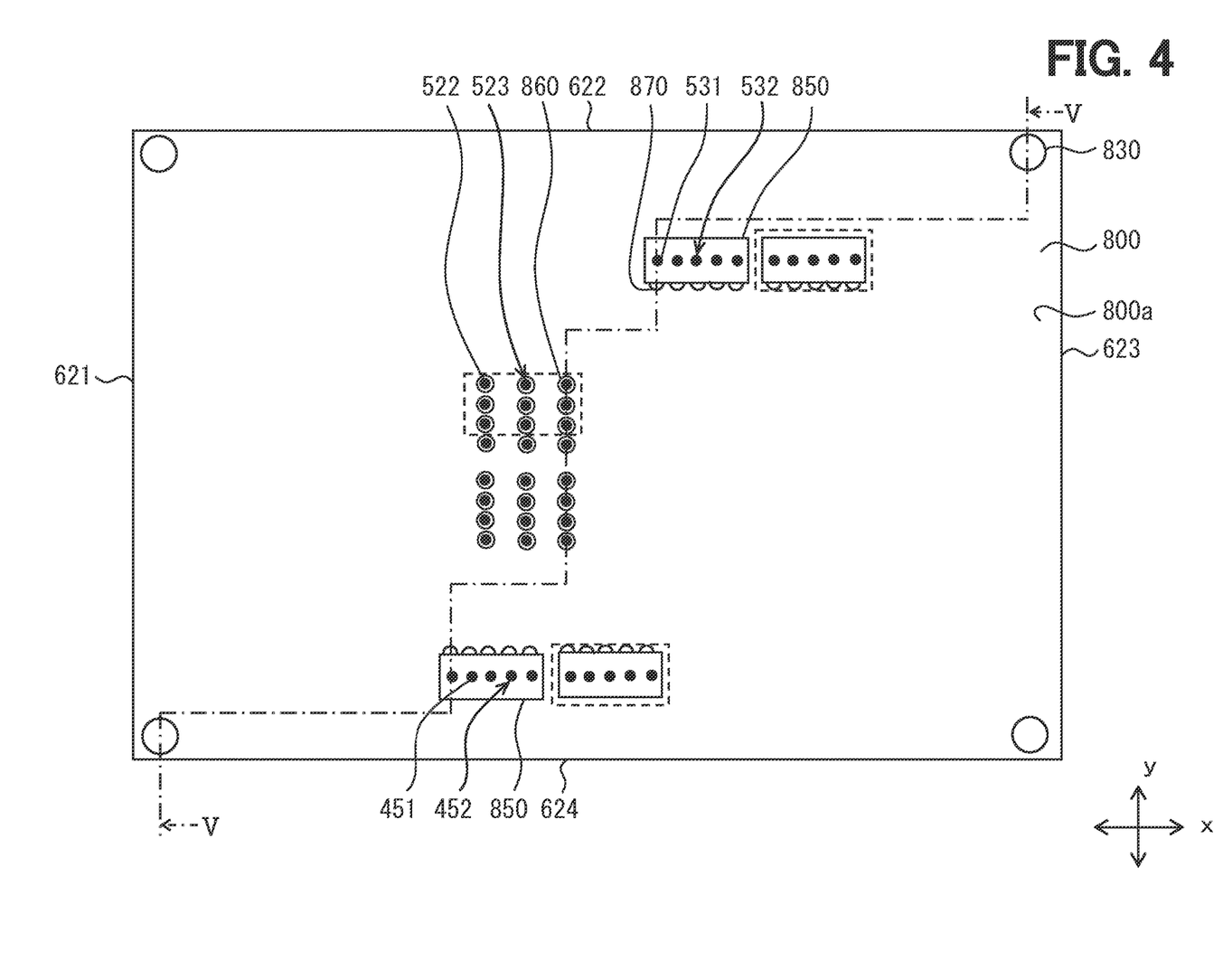
FIG. 4 is a top view of the power conversion device.

Accordingly, as shown in FIGS. 4 and 5, the switch terminal group 523 including the plural switch terminals 522 is connected to the board 800 via the first solder portions 860 in the central area in the y direction. The voltage detection terminal group 532 including the plural voltage detection terminals 531 is connected to the board 800 via the fixing part 850 and the second solder portion 870 in the location adjacent to the end of the board 800 in the y direction. The current detection terminal group 452 including the plural current detection terminals 451 is connected to the board 800 via the fixing part 850 and the second solder portion 870 in the location adjacent to the end of the board 800 in the y direction.

Specifically, the switch terminal group 523 including the plural switch terminals 522 is connected to the board 800 via the first solder portions 860 in the location between the voltage detection terminal group 532 and the current detection terminal group 452. The voltage detection terminal group 532 including the plural voltage detection terminals 531 is connected to the board 800 via the fixing part 850 and the second solder portions 870 in the location adjacent to the second wall portion 622. The current detection terminal group 452 including the plural current detection terminals 451 is connected to the board 800 via the fixing part 850 and the second solder portions 870 at the location adjacent to the fourth wall portion 624.

<Number of Substrate Holes per Unit Area>

As shown in FIG. 3, the plural switch terminal holes 811 included in the switch terminal hole group 812 are arranged in eight rows in the y direction and three columns in the x direction. The plural voltage detection terminal holes 821 included in the voltage detection terminal hole group 822 are arranged in one row in the y direction and ten columns in the x direction. The plural current detection terminal holes 831 included in the current detection terminal hole group 832 are arranged in one row in the y direction and ten columns in the x direction.

The switch terminal holes 811 adjacent in the x direction are apart from each other with a first adjacent distance. The switch terminal holes 811 adjacent in the y direction are apart from each other with a second adjacent distance. The second adjacent distance is smaller than the first adjacent distance. The voltage detection terminal holes 821 adjacent in the x direction are apart from each other with a third adjacent distance, and the third adjacent distance is substantially the same as the second adjacent distance between the switch terminal holes 811 in the y direction.

The number of the switch terminal holes 811 included in a unit area that is surrounded by a dashed line in FIG. 3 and obtained by multiplying a first dimension that is twice the first adjacent distance by a second dimension that is twice the second adjacent distance is greater than the number of the voltage detection terminal holes 821 included in the unit area. Specifically, the number of the switch terminal holes 811 included in the unit area is nine. The number of the voltage detection terminal holes 821 included in the unit area is five.

Note that the arrangement of the voltage detection terminal holes 821 in the y direction is not limited to one row. The voltage detection terminal holes 821 may be arranged in two or more rows in the y direction. The arrangement of the voltage detection terminal holes 821 is not particularly limited as long as the number of the switch terminal holes 811 included per unit area is greater than the number of the voltage detection terminal holes 821 included per unit area.

The current detection terminal holes 831 and the switch terminal holes 811 have the similar relationship to the relationship between the voltage detection terminal holes 821 and the switch terminal holes 811 described above. The number of the switch terminal holes 811 included per unit area is greater than the number of the current detection terminal holes 831 included per unit area.

Of course, the arrangement form of the terminal holes provided in each of the switch terminal hole group 812, the voltage detection terminal hole group 822, and the current detection terminal hole group 832 is not limited to the examples described hereinabove. The number of the voltage detection terminal holes 821 included per unit area and the current detection terminal holes 831 included per unit area are also not limited to the examples described hereinabove.

Even in those cases, the number of the switch terminal holes 811 included per unit area should be larger than the number of the voltage detection terminal holes 821 and the number of the current detection terminal holes 831 included per unit area.

<Thickness of Connecting Part>

As described above, the guide parts 840 are connected to the lower surface 800b of the board 800 at the positions corresponding to the location where the voltage detection terminal hole group 822 is formed and the location where the current detection terminal hole group 832 is formed.

The fixing parts 850 are connected to the upper surfaces 800a of the board 800 at the positions corresponding to the location where the voltage detection terminal hole group 822 is formed and the location where the current detection terminal hole group 832 is formed.

In the following, for the sake of simplicity of explanation, it is assumed that the board 800 includes the guide parts 840 and the fixing parts 850, and sections of the board 800 where the guide parts 840 and the fixing pats 850 are connected are referred to as connecting part.

As shown in FIG. 5, the connecting part composed of the position of the board 800 where the voltage detection terminal hole group 822 is formed, the guide part 840 and the fixing part 850 is referred to as a first connecting part. The thickness in the z direction of the first connecting part is greater than the thickness in the z direction of the portion of the board 800 where switch terminal hole group 812 is formed. As a result, the section modulus of the first connecting part is larger than the section modulus of the portion of the board 800 where the switch terminal hole group 812 is formed.

Likewise, the connecting part composed of the portion of the board 800 where the current detection terminal hole group 832 is formed, the guide part 840 and the fixing part 850 is referred to as a second connecting part. Similarly, the thickness in the z direction of the second connecting part is greater than the thickness in the z direction of the portion of the board 800 where the switch terminal hole group 812 is formed. As a result, the section modulus of the second connecting part is larger than the section modulus of the portion of the board 800 where the switch terminal hole group 812 is formed.

Advantageous Effects

As described above, the number of the switch terminal holes 811 per unit area is greater than the number of the current detection terminal holes 831 per unit area and the number of the voltage detection terminal holes 821 per unit area.

The number of connection points of the first solder portions 860, which connect the switch terminals 522 to the board 800, per unit area is greater than the number of connection points of the second solder portions 870 and the fixing part 850, which connect the current detection terminals 451 to the board 800, per unit area.

The number of connection points of the first solder portions 860, which connect the switch terminal 522 to the board 800, per unit area is greater than the number of connection points of the second solder portions 870 and the fixing part 850, which connect the voltage detection terminals 531 to the board 800, per unit area.

Therefore, it is less likely that the board 800 will be deformed in the z direction at the position where the switch terminal hole group 812 is formed. Application of stress to the switch terminal group 523 will be suppressed. As a result, the switch terminal group 523 is less likely to be damaged. In addition, poor connection between the switch terminal group 523 and the first solder portions 860 is less likely to occur.

The thickness in the z direction of the first connecting part is greater than the thickness in the z direction of the portion of the board 800 where the switch terminal hole group 812 is formed. The thickness in the z direction of the second connecting part is greater than the thickness in the z direction of the portion of the board 800 where the switch terminal hole group 812 is formed.

The section modulus of the first connecting part is larger than the section modulus of the portion of the board 800 where the switch terminal hole group 812 is formed. The section modulus of the second connecting part is larger than the section modulus of the portion of the board 800 where the switch terminal hole group 812 is formed.

As a result, it is less likely that the first connecting part and the second connecting part will be deformed in the z direction. Application of stress to the current detection terminal group 452 and the voltage detection terminal group 532 will be suppressed. As a result, the current detection terminal group 452 and the voltage detection terminal group 532 are less likely to be damaged.

Even when the guide part 840 and the fixing part 850 are connected only to the portions of the board 800 where the voltage detection terminal hole group 822 and the current detection terminal hole group 832 are formed, each of the terminal groups connected to the board 800 is less likely to be damaged. Since the guide part 840 and the fixing part 850 are provided only partially in this manner, an increase in the size of the power conversion device 300 is easily suppressed.

As described above, the switch terminal group 523 is connected to the board 800 via the first solder portions 860 in the central area of the board 800 in the y direction. The voltage detection terminal group 532 is connected to the board 800 via the fixing part 850 and the second solder portions 870 in the area adjacent to the end of the board 800 in they direction. The current detection terminal group 452 is connected to the board 800 via the fixing part 850 and the second solder portions 870 in the area adjacent to the end of the board 800 in the y direction. The voltage detection terminal group 532 and the current detection terminal group 452 have fewer connection points with the substrate 800 than the switch terminal group 523.

The board 800 is connected to the upper end surface 620*a* of the housing 600 via the fastening members 830 at its ends in the planar direction. For this reason, the board 800 is less likely to deformed in the z direction at the ends in the planar direction than the central area in the planar direction. As a result, stress applied to each of the voltage detection terminal group 532 and the current detection terminal group 452 will be suppressed.

First Modification

Figure 6:
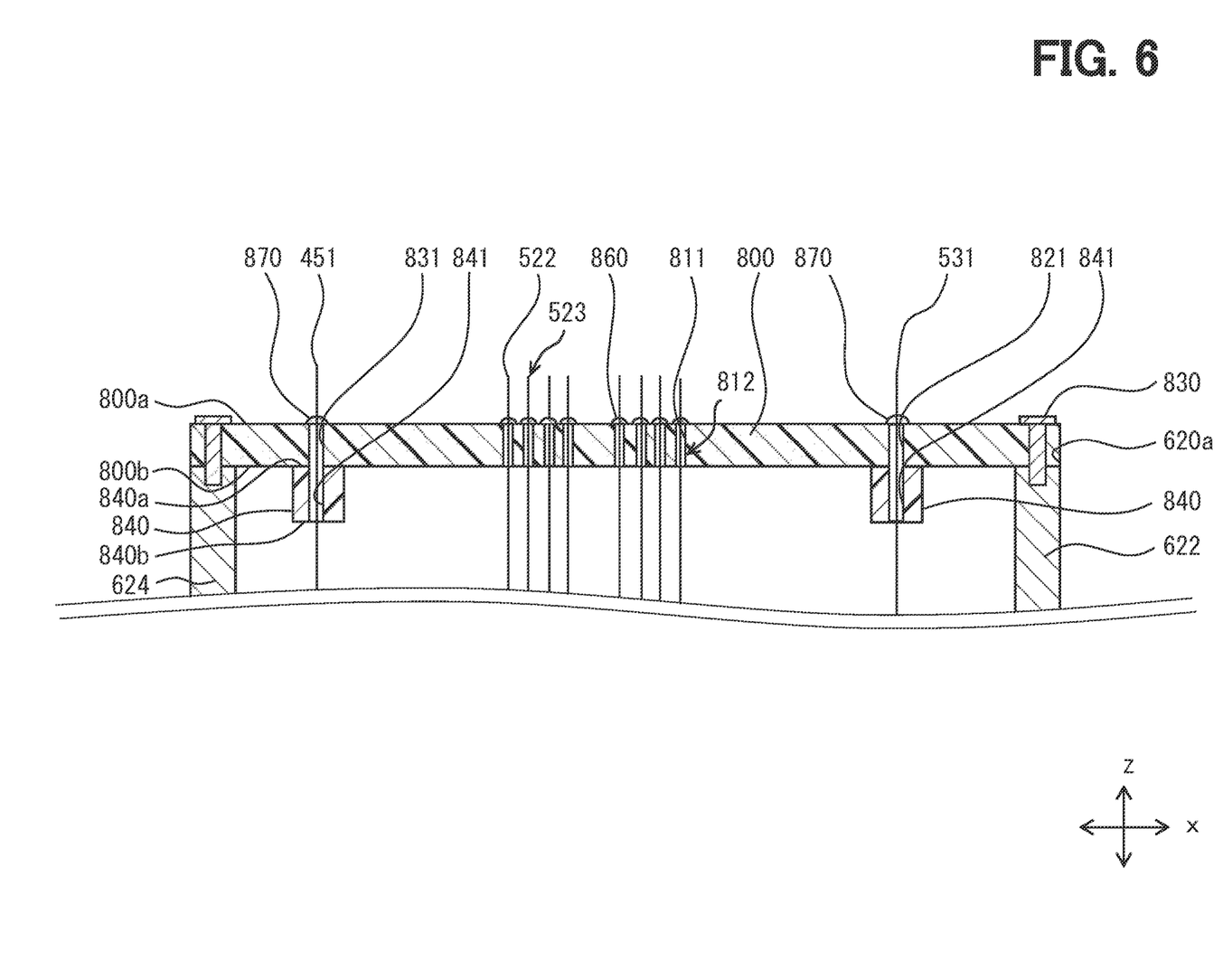
FIG. 6 is a cross-sectional view for explaining a first modification.

In the embodiment described hereinabove, the guide part 840 and the fixing part 850 are connected to the board 800. However, the fixing part 850 may not be connected to the board 800 as shown in FIG. 6. In such a case, the plural current detection terminals 451 extending toward the board 800 may be inserted into the communication holes provided by the guide holes 841 and the current detection terminal holes 831 and be connected to the board 800 via the second solder portions 870.

Similarly, as shown in FIG. 6, the plural voltage detection terminals 531 extending toward the board 800 may be inserted into the communication holes provided by the guide holes 841 and the voltage detection terminal holes 821, and be connected to the board 800 via the second solder portions 870.

Also in such cases, the thickness in the z direction of a third connecting part composed of the portion of the board 800 where the voltage detection terminal hole group 822 is formed and the guide part 840 is larger than the thickness in the z direction of the portion of the board 800 where the switch terminal hole group 812 is formed. The section modulus of the third connecting part is larger than the section modulus of the portion of the board 800 where the switch terminal hole group 812 is formed.

The thickness in the z direction of a fourth connecting part composed of the portion of the board 800 where the current detection terminal hole group 832 is formed and the guide part 840 is larger than the thickness in the z direction of the portion of the board 800 where the switch terminal hole group 812 is formed. The section modulus of the fourth connecting part is larger than the section modulus of the portion of the board 800 where the switch terminal hole group 812 is formed.

Therefore, each of the third connecting part and the fourth connecting part is less likely to be deformed in the z direction. As a result, the current detection terminal group 452 and the voltage detection terminal group 532 are less likely to be damaged.

Further, the guide holes 841 suppress the amplitude of the current detection terminal group 452 and the voltage detection terminal group 532 in the planar direction. Therefore, the second solder portions 870 are less likely to receive stress. Poor connection between the second solder portions 870 and each of the current detection terminal group 452 and the voltage detection terminal group 532 will be suppressed.

The switch terminal group 523 including the plural switch terminals 522 is connected to the board 800 via the first solder portions 860 in the central area of the board 800 in the y direction. The voltage detection terminal group 532 including the plural voltage detection terminals 531 is connected to the board 800 via the second solder portions 870 in the area adjacent to the end of the board 800 in the y direction. The current detection terminal group 452 including the plural current detection terminals 451 is connected to the board 800 via the second solder portions 870 in the area adjacent to the end of the board 800 in the y direction.

Specifically, the switch terminal group 523 including the plural switch terminals 522 is connected to the board 800 via the first solder portions 860, in the area between the voltage detection terminal group 532 and the current detection terminal group 452. The voltage detection terminal group 532 including the plural voltage detection terminals 531 is connected to the board 800 via the second solder portions 870 in the area adjacent to the second wall portion 622. The current detection terminal group 452 including the plural current detection terminals 451 is connected to the board 800 via the second solder portions 870 in the area adjacent to the fourth wall portion 624.

The voltage detection terminal group 532 and the current detection terminal group 452 each have fewer connection points with the board 800 than the switch terminal group 523. The board 800 is connected to the upper end surface 620*a* of the housing 600 via the fastening members 830 at its ends in the planar direction. The board 800 is less likely to be deformed in the z direction at the ends in the planar direction than in the central area in the planar direction. As a result, stress applied to the voltage detection terminal group 532 and the current detection terminal group 452 will be suppressed.

Second Modification

Figure 7:
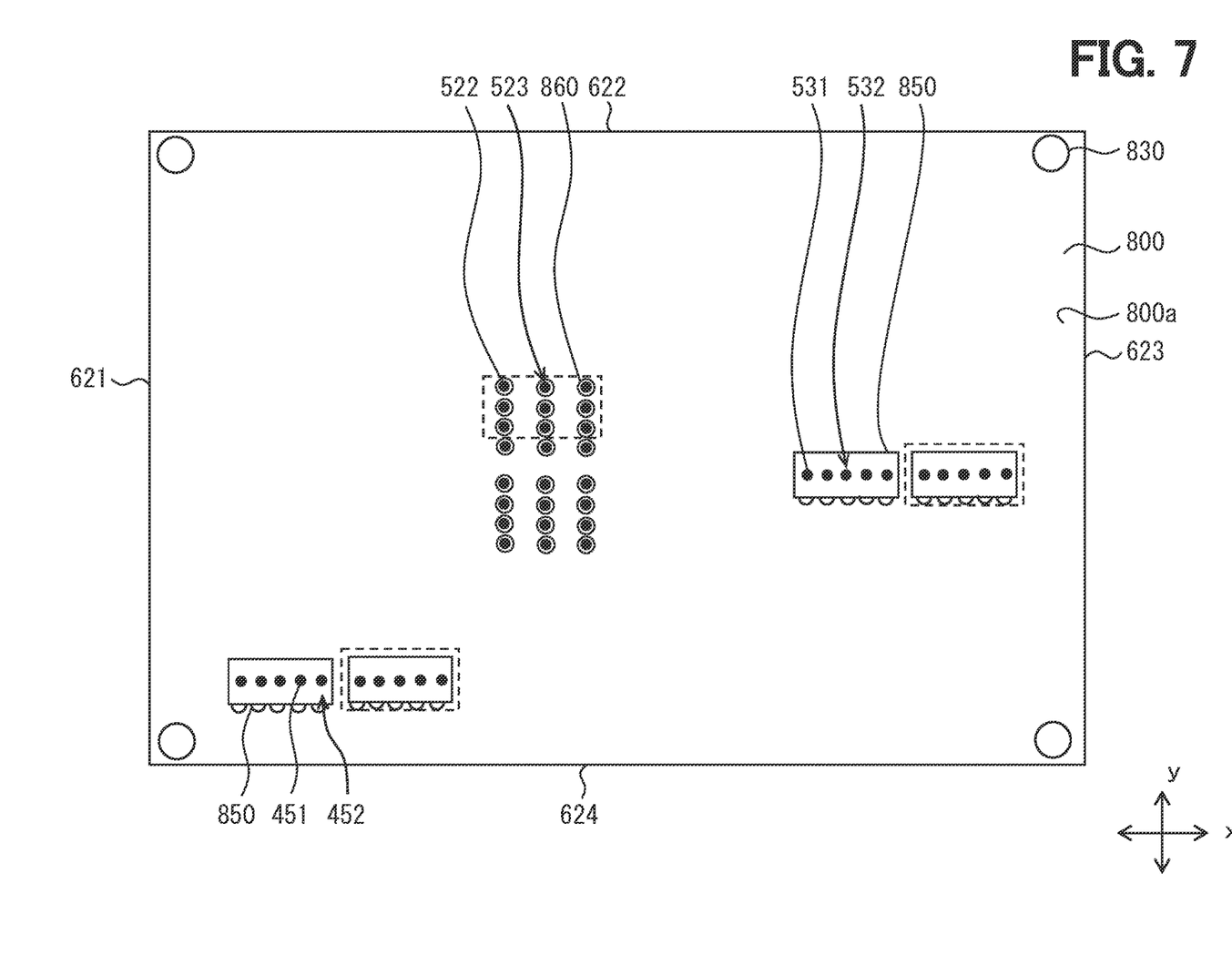
FIG. 7 is a cross-sectional view for explaining a second modification.

In the embodiment described hereinabove, as shown in FIG. 4, the voltage detection terminal group 532 and the current detection terminal group 452 are connected to the board 800 in the areas adjacent to the ends of the board 800 in they direction, and the switch terminal group 523 is connected to the board 800 in the central area in the y direction. However, as shown in FIG. 7, the voltage detection terminal group 532 and the current detection terminal group 452 may be connected to the board 800 in areas adjacent to the ends of the board 800 in the x direction, and the switch terminal group 523 may be connected to the board 800 in the central area in the x direction.

Other Modifications

In the embodiments described hereinabove, the inverter 500 is exemplarily included in the power conversion device 300. Alternatively, the power conversion device 300 may include a converter in addition to the inverter 500.

In the embodiments described hereinabove, the power conversion device 300 is exemplarily included in the in-vehicle 100 for a battery electric vehicle. However, the application of the power conversion device 300 is not particularly limited to the above example. For example, the power conversion device 300 may be included in a hybrid system that includes the motor 400 and an internal combustion engine.

In the embodiment described hereinabove, one motor 400 is exemplarily connected to the power conversion device 300. Alternatively, plural motors 400 may be connected to the power conversion device 300. In such a case, the power conversion device 300 includes plural three-phase switch modules 520 for forming the inverter 500.

Although the present disclosure has been made in accordance with the embodiments, it is understood that the present disclosure is not limited to such embodiments and structures. The present disclosure encompasses various modifications and variations within the scope of equivalents. In addition, while the various elements are shown in various combinations and configurations, which are exemplary, other combinations and configurations, including more, less or only a single element, are also within the spirit and scope of the present disclosure.

What is claimed is:

1. A power conversion device comprising:
a first electrical component having a plurality of first signal terminals;
a second electrical component having a plurality of second signal terminals;
a housing accommodating and fixing the first electrical component and the second electrical component;
a board having a first surface and a second surface opposite to the first surface in a predetermined direction that is orthogonal to the first surface, the board being formed with a plurality of first through holes defining openings on the first surface and the second surface and receiving the plurality of first signal terminals therein and a plurality of second through holes defining openings on the first surface and the second surface and receiving the plurality of second signal terminals therein;
a guide part having a plurality of guide holes defining a plurality of openings in the predetermined direction, the guide part connected to at least one of the first surface and the second surface of the board so that the plurality of guide holes and the plurality of second through holes are aligned in the predetermined direction;
a first connection portion connecting the plurality of first signal terminals to the board; and
a second connection portion connecting the plurality of second signal terminals to the board, wherein
a number of the first through holes disposed part unit area is greater than a number of the second through holes disposed per unit area,
the plurality of first through holes are located in a central area in a planar direction of the board, the planar direction being orthogonal to the predetermined direction,
the plurality of second through holes are located in an area adjacent to an end of the board in the planar direction, and
the end of the board is connected to the housing.

2. The power conversion device according to claim 1, wherein
the second connection portion includes a solder member.

3. The power conversion device according to claim 1, wherein
the second connection portion includes a fixing part having a conductive member and a solder member.

\* \* \* \* \*